US007608975B2

(12) United States Patent
Orlando et al.

(10) Patent No.: US 7,608,975 B2
(45) Date of Patent: Oct. 27, 2009

(54) PIEZOELECTRICALLY-CONTROLLED INTEGRATED MAGNETIC DEVICE

(75) Inventors: Bastien Orlando, Les Pennes Mirabeau (FR); Bernard Viala, Sassenage (FR); Sébastien Hentz, Grenoble (FR)

(73) Assignees: Commissariat a l'Energie Atomique, Paris (FR); STMicroelectronics SA, Montrouge (FR)

( * ) Notice: Subject to any disclaimer, the term of this patent is extended or adjusted under 35 U.S.C. 154(b) by 204 days.

(21) Appl. No.: 11/898,331

(22) Filed: Sep. 11, 2007

(65) Prior Publication Data

US 2008/0068759 A1 Mar. 20, 2008

(30) Foreign Application Priority Data

Sep. 12, 2006 (FR) .................................. 06 07966

(51) Int. Cl.
*H01L 41/08* (2006.01)
*H01F 21/08* (2006.01)

(52) U.S. Cl. ...................... 310/311; 310/340; 310/359; 336/130

(58) Field of Classification Search ................... 310/26, 310/311, 328, 340, 359; 331/181; 334/71; 336/130
See application file for complete search history.

(56) References Cited

U.S. PATENT DOCUMENTS 6,184,755 B1 2/2001 Barber et al.
2003/0030527 A1* 2/2003 Mhani et al. ................ 336/130
2008/0061916 A1* 3/2008 Pulskamp .................. 336/130

FOREIGN PATENT DOCUMENTS

JP 6-97957 A * 9/1992 ................ 336/130
JP A 8-288143 11/1996
JP A 11-40427 2/1999
JP A 2000-296612 10/2000
WO WO 2005/064590 A1 7/2005
WO WO 2005/064783 A2 7/2005

OTHER PUBLICATIONS

Vroubel, M., et al. "Integrated Tunable Magnetic RF Inductor," *IEEE Electron Device Letters*, vol. 25, No. 12, pp. 787-789 (2004).
Frommberger, M., et al. "Processing and Application of Magnetoelastic Thin Films in High-Frequency Devices," *Microelectronic Engineering* vol. 67, No. 68, pp. 588-594 (2003).
Ludwig, A., et al. "High-Frequency Magnetoelastic Multilayer Thin Films and Applications," *IEEE Transaction on Magnetics*, vol. 39, No. 5, pp. 3062-3067 (2003).

(Continued)

*Primary Examiner*—Thomas M Dougherty
(74) *Attorney, Agent, or Firm*—Oliff & Berridge, PLC

(57) ABSTRACT

The magnetic device according to the invention is integrated on a substrate and comprises at least one element made of piezoelectric material associated with actuating electrodes, and at least one magnetic element able to deform under the stress of the piezoelectric material element. The device has the form of a beam movable with respect to the substrate, and comprises two transverse parts of predetermined width, along a reference longitudinal axis. The piezoelectric material element is formed by at least a part of a transverse part and each transverse part comprises a zone for mechanical anchoring on the substrate. The transverse parts are connected by at least one central branch, of predetermined width, on which the magnetic element is arranged.

26 Claims, 8 Drawing Sheets

OTHER PUBLICATIONS

Wan, J.G., et al. "Magnetoelectric Properties of a Heterostructure of Magnetostrictive and Piezoelectric Composites," *IEEE Transactions on Magnetics*, vol. 40, No. 4, pp. 3042-3044 (2004).

Arai, K.I., et al. "A New Hybrid Device Using Magnetostrictive Amorphous Films and Piezoelectric Substrates," *IEEE Transactions on Magnetics*, vol. 30, No. 2, Pt. 2, pp. 916-918 (1994).

Luckebe, V.M., et al. "Self-Assembling MEMS Variable and Fixed RF Inductors," *IEEE Transaction on Microwave Theory and Techniques*, vol. 49, No. 11, pp. 2093-2098 (2001).

Sarkar, N., et al. "Microassembled Tunable Mems Inductor," *IEEE MEMS*, pp. 183-186 (2005).

* cited by examiner

PIEZOELECTRICALLY-CONTROLLED INTEGRATED MAGNETIC DEVICE

BACKGROUND OF THE INVENTION

The invention relates to a variable-response magnetic device integrated on a substrate and comprising at least one element made of piezoelectric material associated with actuating electrodes, and at least one magnetic element able to deform under the stress of the piezoelectric material element.

The invention applies in particular to variable inductors, transmission line elements such as resonators, phase shifters or couplers, or again spin oscillators.

STATE OF THE ART

Several types of integrated or semi-integrated variable inductors exist, totally or partially achieved by integrated fabrication techniques originating from microelectronics and enabling continuous and reversible inductance variations. However, the different types of components produced up to now present numerous shortcomings, in particular a too small inductance variation, instability according to the frequency, an actuating mode that is costly in terms of power, etc.

A conventional integrated passive component with inductance variation is generally composed of a coil in one or more parts, in most cases having a very high conductivity, and possibly of one or more magnetic parts, called "magnetic cores", in most cases having a high relative permeability (typically $\mu_R>100$). There are three known main principles able to be used for inductance variation.

The first principle consists in adjusting the mutual inductances within the coil by modifying the geometry of the latter, as described in particular in U.S. Pat. No. 6,184,755 and in the article "Self-Assembling MEMS Variable and Fixed RF Inductors" by Lubecke et al. (IEEE Trans. Mic. Th. and Tech. Vol. 49 n°11, 2001). It is also possible to adjust the coupling with a secondary winding or with any other conducting part. This principle is the simplest to implement in integrated devices, but it only enables small inductance variations to be achieved.

The second principle consists in adjusting the coupling between the coil and the magnetic element by modifying their relative distance, as described in particular in the article "Microassembled Tunable MEMS Inductor" by Sarkar et al. (IEEE MEMS 2005). This principle enables large inductance variations to be achieved, but poses the problem of actuation, as it requires movements of large amplitude in the plane of the substrate on which the component is produced (typically around 10 μm).

The third principle consists in adjusting the permeability of the magnetic material itself. Several known devices (essentially discrete components) use application of a magnetic field to make the permeability vary, as described in particular in the article "Integrated Tunable Magnetic RF Inductor" by Vroubel et al. (IEEE Elec. Dev. Letter vol. 25 n°12, 2004). However, application of a magnetic field requires continuous use of currents, which results in a large power consumption.

Another means exists consisting in using the variation of the magnetic permeability of the material according to the mechanical stresses that are applied thereto, as described in particular in the article "Processing and application of magnetoelastic thin films in high-frequency devices" by Frommberger et al. (Microelectronics Engineering 67-68 2003) and in the article "High-Frequency Magnetoelastic Multilayer Thin Films and Applications" by Ludwig et al. (IEEE Trans. Mag. Vol. 39 n°5, 2003). This property is due to the magnetomechanical coupling present in all magnetic materials on various scales and known under the name of magnetoelasticity.

In known manner in magnetoelasticity, it is essential to control the amplitude and direction of the stresses applied in a layer of uniaxial magnetic material. The stresses do in fact have a large influence on the dynamic behavior of the magnetic material. If the stresses are too inhomogeneous or are not applied in directions in the plane of the substrate at 0° or 90° from the axis of anisotropy of the magnetic material, it becomes very difficult to forecast the magnetic properties according to the stresses applied. The permeability variation and the dynamic behavior of the magnetic layer are then no longer controllable.

Moreover, it is necessary to determine the actuating mode of the inductor. Piezoelectric materials are generally used on account of their integration capacity and their low power consumption. Devices combining piezoelectric layers and magnetoelastic layers, in the form of stacks or heterostructures, have already been studied and envisaged for achieving resonators or sensors or variable inductors, as described for example in the article "A New Hybrid Device using Magnetostrictive Amorphous Films and Piezoelectric Substrates" by Arai et al. (IEEE Trans. Mag. Vol. 30 n°2, 1994).

As represented schematically in FIG. 1, the article above describes a device 1 comprising a substrate 2 made from piezoelectric material partially covered on the top and on the bottom by two electrodes 3, 4, respectively upper and lower, the upper electrode 3 being made from a magnetic material. A voltage applied between the electrodes 3, 4 then results in application of piezoelectric stresses σ in the substrate 2, which are then transmitted to the magnetic material, thus causing a variation of its magnetic properties.

The article "Magnetoelectric Properties of a Heterostructure of Magnetostrictive and Piezoelectric Composites" by Wan et al. (IEEE Trans. Mag. Vol. 40 n°4, 2004) also describes another example of a device combining the use of piezoelectric materials and magnetoelastic materials. As represented schematically in FIG. 2, the device 1 can be composed by a heterostructure comprising a portion 5 of magnetostrictive material with a parallel magnetic field M, and a portion 6 of piezoelectric material with an electric field E perpendicular to the magnetic field M.

The devices described above are not integrated but are produced in bulk piezoelectric substrates. Moreover, the mechanical stresses are not controlled, as the piezoelectric material applies stresses in all the directions of the plane. Consequently, the inductance variation is difficult to control and the electromagnetic properties at high frequencies are mediocre.

Furthermore, the document WO 2005/064590 describes a magnetic device comprising on a substrate a stack of a piezoelectric layer fully secured to the substrate and means for generating a surface acoustic wave located on the piezoelectric layer on each side of a ferromagnetic element. The piezoelectric layer is designed to participate in generation of the surface wave and to ensure propagation thereof to the ferromagnetic element.

The document WO 2005/064783 describes different possible structures for a spin oscillator. The first structure comprises on a substrate a piezoelectric layer integral to the substrate and in contact with the free ferromagnetic layer of the oscillator. The above structure comprises actuating means located on each side of the ferromagnetic layer. Application of an electric field causes a deformation at the level of the piezoelectric layer that is transmitted to the ferromagnetic layer. This results in a variation of the magnetoelastic properties of the ferromagnetic layer and therefore a modification of the oscillator frequency and of its quality factor.

A second structure comprises a piezoelectric layer locally suspended with respect to the substrate and in contact with the free layer of the oscillator. Unlike the first structure, the piezoelectric effect is not used, i.e. deformation of the suspended membrane is achieved by electrostatic (or capacitive) effect by means of the dielectric nature of the piezoelectric layer.

A third structure comprises a piezoelectric layer that is also suspended, but at a distance from the free layer of the oscillator. The suspended structure comprises another magnetic element and only serves the purpose of modifying the magnetostatic coupling between the two magnetic elements.

For all the structures described above, no control of the direction of the stresses induced on the ferromagnetic material is performed and the suspended structures described do not in any way act so as to control these stresses.

OBJECT OF THE INVENTION

The object of the invention is to remedy all the above-mentioned shortcomings and has the object of providing an integrated variable-response magnetic device enabling large response variations to be achieved, and enabling these variations to be well controlled, even for high frequencies, by mastering the mechanical stresses imposed on the magnetic material, in order in particular to apply a uniaxial, homogeneous stress of great amplitude in the uniaxial magnetic material.

The object of the invention is characterized in that the device is in the form of a beam that is movable with respect to the substrate and comprising two transverse parts of predetermined width, along a reference longitudinal axis, and in that:

- the piezoelectric material element is formed by at least one part of a transverse part,
- each transverse part comprises a zone for mechanical anchoring on the substrate,
- and the transverse parts are connected by at least one central branch, of predetermined width, on which the magnetic element is arranged.

BRIEF DESCRIPTION OF THE DRAWINGS

Other advantages and features will become more clearly apparent from the following description of particular embodiments of the invention given for non-restrictive example purposes only and represented in the accompanying drawings, in which.

DESCRIPTION OF PARTICULAR EMBODIMENTS

With reference to the figures, the integrated variable-response magnetic device according to the invention will be described in non-restrictive manner as a variable inductor. However, the device according to the invention also concerns other types of magnetic devices, i.e. elements for antennas, filters or phase shifters, spin oscillators, etc.

With reference to the figures, the integrated variable-response magnetic device is a variable inductor 1 integrated on a substrate that is able to be applied to all fields requiring a continuous (or discrete) and reversible inductance or impedance variation with a low actuating power.

Figure 1:
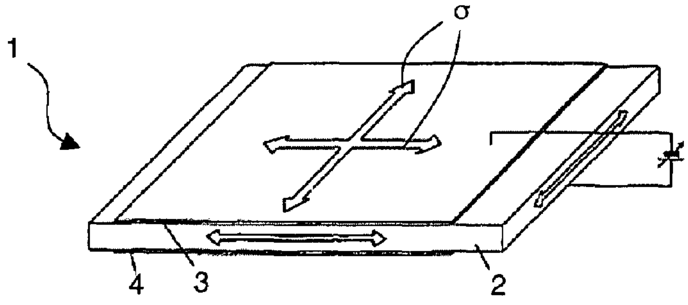
FIG. 1 (prior art)
FIG. 1 schematically represents a particular embodiment of a magnetic device according to the prior art, with a multilayer structure.
Figure 2:
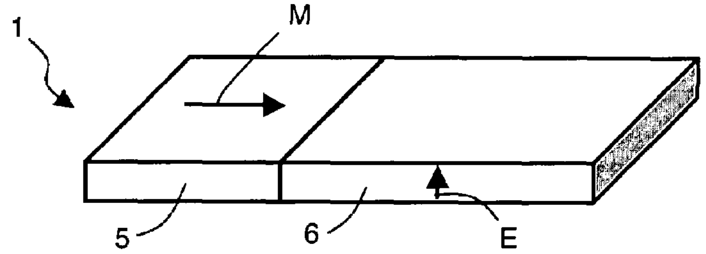
FIG. 2 (prior art)
FIG. 2 schematically represents another particular embodiment of a magnetic device according to the prior art, composed of a heterostructure.
Figure 3:
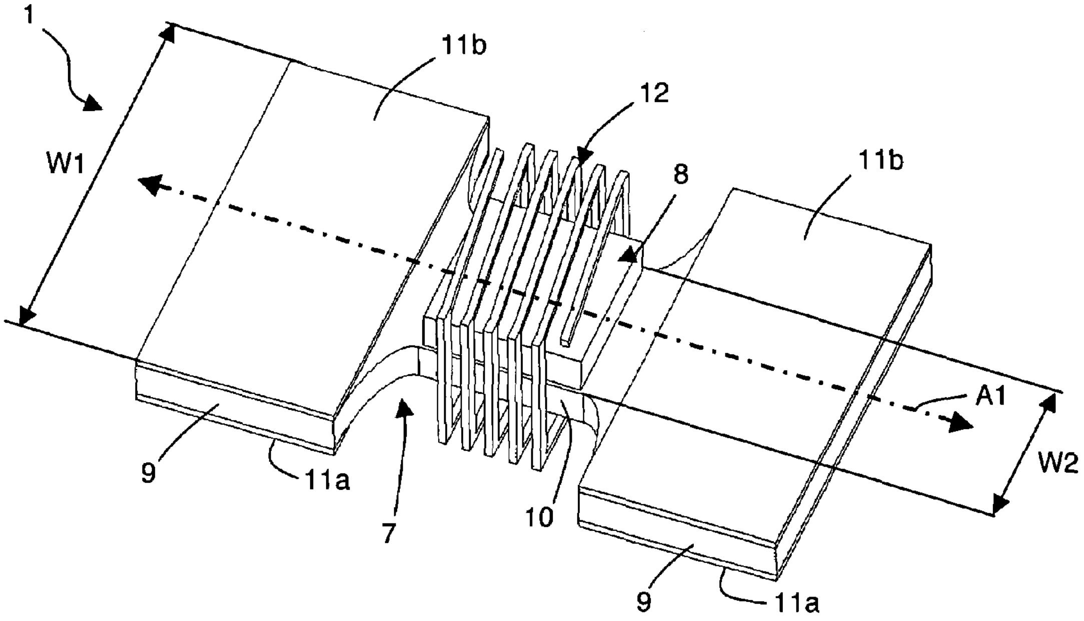
FIG. 3 represents a particular embodiment of an integrated variable-response magnetic device according to the invention.

In the particular embodiment represented in FIG. 3, the variable inductor 1 is in the form of a beam 7 made of piezoelectric material designed to generate mechanical stresses in a magnetic element 8 made of magnetic material having a permeability varying according to the stresses that are applied to it. The beam 7 has substantially the form of a tensile test bar and comprises, along a reference longitudinal axis A1 (FIG. 3), two transverse parts 9 of predetermined length W1 and a central branch 10 of predetermined length W2 advantageously smaller than the width W1 of the transverse parts 9, on which the magnetic element 8 is arranged.

The beam 7 is anchored in a substrate (not represented in FIGS. 1 to 14 and 21 to 23 for reasons of clarity), on which the variable inductor 1 is formed, preferably at the level of mechanical anchoring zones 16 (FIG. 7) advantageously located at the ends of the transverse parts 9. The beam 7 is thus free in movement relative to the substrate, outside its anchoring zones 16, to allow a maximum deformation amplitude.

The shape of the piezoelectric material beam 7 has been chosen and optimized to generate uniaxial and homogeneous stresses in the associated magnetic element 8.

In FIG. 3, the variable inductor 1 comprises actuating electrodes 11*a*, 11*b*, placed on each side of the beam 7, cooperating with the piezoelectric material beam 7 and generating the required actuating voltage for application of the mechanical stresses in the magnetic element 8. Depending on the voltage applied between the electrodes 11*a* and 11*b*, i.e. positive or negative, compressive or tensile stresses are generated in the magnetic element 8.

The magnetic element 8 is preferably made from a uniaxial magnetic material composed of an iron- and/or cobalt- and/or nickel-based alloy, for example deposited under a magnetic field to enhance the anisotropy of the material. Advantageously, the direction of anisotropy is substantially parallel or perpendicular to the reference longitudinal axis A1 of the beam 7.

Figure 21:
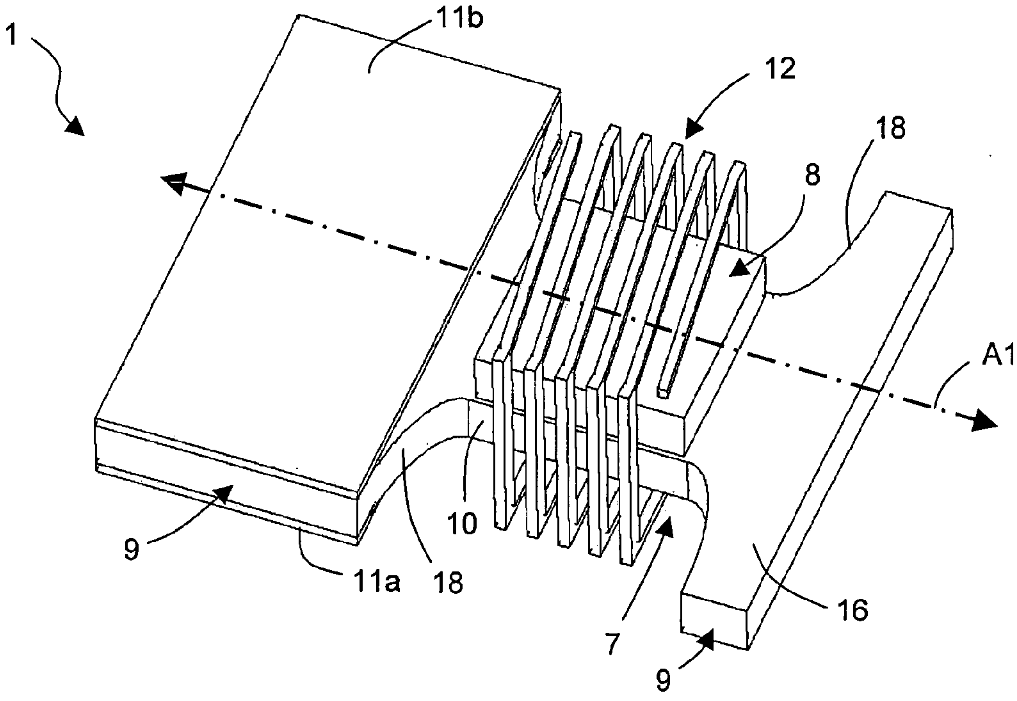
FIG. 21 schematically represents a perspective view of another alternative embodiment of a magnetic device according to the invention.

In FIG. 3, the inductor 1 comprises lower electrodes 11*a* and upper electrodes 11*b* preferably extending over most of the surface of the transverse parts 9, respectively below and above the latter. In an alternative embodiment, not represented, a single transverse part 9 can comprise actuating electrodes, the transverse part 9 that does not comprise any electrodes then essentially serving the purpose of anchoring the beam 7 in the substrate (FIG. 21).

The variable inductor 1 preferably comprises a solenoid coil 12 surrounding the central branch 10 and the associated magnetic element 8. The coil 12 acts as electrically conducting element designed to create a magnetic field around the magnetic element 8, with an inductance value varying according to the voltage applied by the electrodes 11 on the beam 7.

Figure 4:
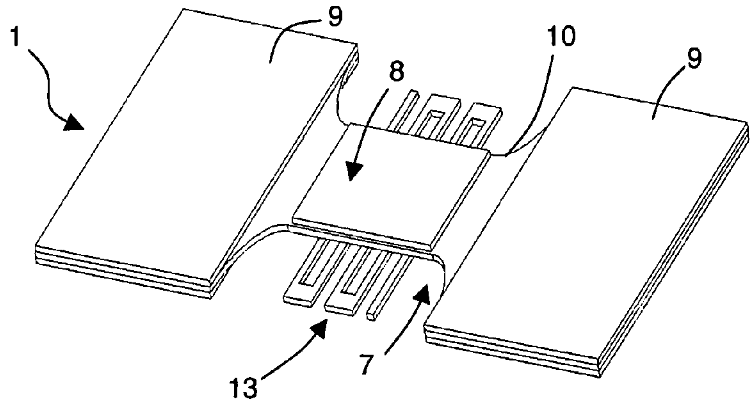
FIGS. 4 to 6 schematically represent alternative embodiments of a magnetic device according to FIG. 3.
Figure 5:
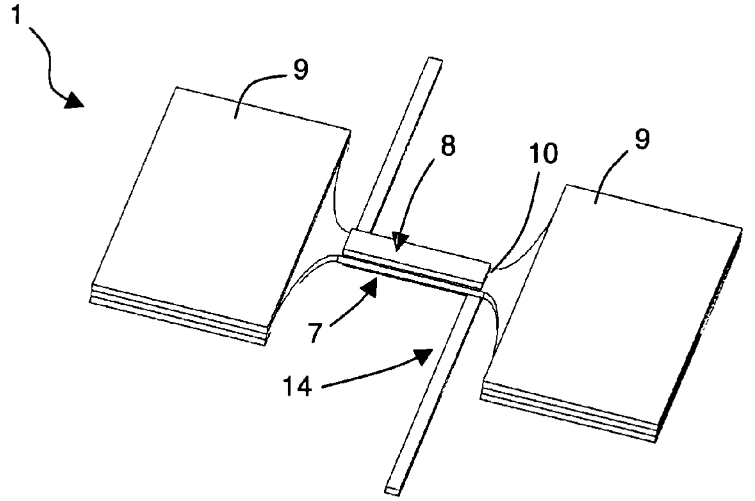
Figure 6:
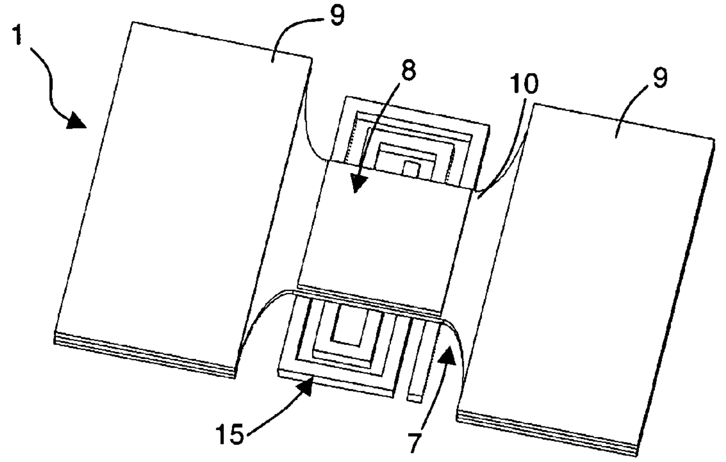

In the alternative embodiments of the variable inductor 1 represented in FIGS. 4, 5 and 6, the coil 12 can be replaced by other electrically conducting elements. In FIG. 4, the electrically conducting element is a wire in serpentine form 13 comprising a plurality of successive parallel branches arranged close to the magnetic element 8. The loops of the serpentine 13 are preferably arranged under the central branch 10 of the beam 7.

In FIG. 5, the electrically conducting element is a wire in the form of lines 14 arranged close to the magnetic element 8, preferably under the central branch 10 of the beam 7 supporting the magnetic element 8. The wire in the form of lines 14 comprises for example two first parallel lines perpendicular to the central branch 10 of the beam 7 and connected by a third line extending along the magnetic element 8, under the central branch 10.

In FIG. 6, the electrically conducting element is a wire in the form of a spiral 15 extending close to the magnetic element 8, preferably under the central branch 10 of the beam 7 supporting the magnetic element 8.

Figure 7:
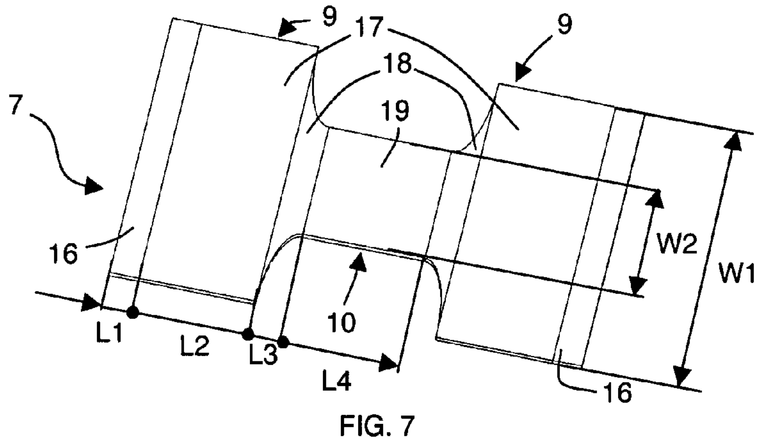
FIG. 7 is a top view of the beam of the magnetic device according to FIG. 3.

In FIG. 7, only the piezoelectric material beam 7 is represented. The transverse parts 9 of the beam 7 each comprise an anchoring zone 16, of length L1 and width W1, defining the end of the transverse zones 9 opposite the central branch 10, performing anchoring and providing a strong mechanical link with the substrate (not represented in FIG. 7 for reasons of clarity), on which the variable inductor 1 is fabricated. The remaining zone 17 of the transverse parts 9, of length L2 and width W1, then performs generation most of the stresses of the beam 7.

Each transverse part 9 of the beam 7 is extended by an optional transition zone 18, of length L3 and variable cross-section, extending from the zones 17 of the transverse parts 9 up to the central branch 10 of the beam 7 and preferably presenting an elliptical shape advantageously tangent to the zone 17 of the transverse parts 9 and to the central branch 10 of the beam 7. The central branch 10, of length L4 and width W2, defines a useful zone 19 of the beam 7, corresponding to the zone of the beam 7 in contact with the magnetic element 8. In the case of presence of the transition zones 18, the upper electrodes 11*b* and lower electrodes 11*a* preferably do not extend up to the transition zones 18 (FIG. 7).

Each transition zone 18 of elliptical shape in particular enables the stresses to be distributed homogeneously, while ensuring a maximum compactness of the variable inductor 1. Moreover, such a beam 7 embedded at its ends only (anchoring zones 16) also enables larger stresses to be applied, enables these stresses to be better controlled and reduces stray capacitances.

Figure 8:
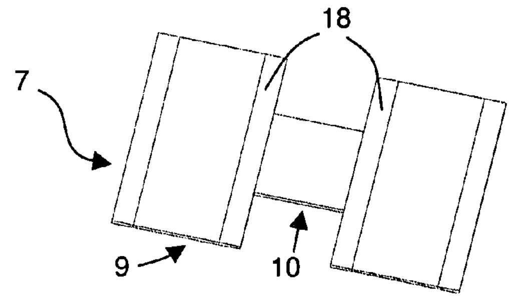
FIGS. 8 to 10 are top views of the beam of alternative embodiments of the magnetic device according to FIG. 7.
Figure 9:
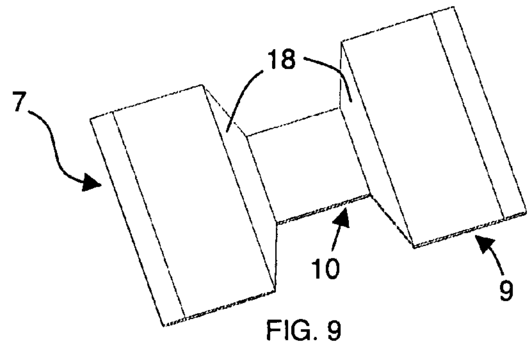

In the alternative embodiments represented in FIGS. 8 and 9, the transition zones 18 of the beam 7 can have a simpler shape, for example rectangular (FIG. 8) or trapezoid (FIG. 9). In another alternative embodiment, not represented, the shape of the transition zones 18 can be elliptical and not tangent to the central branch 10 and to the transverse parts 9.

Figure 10:
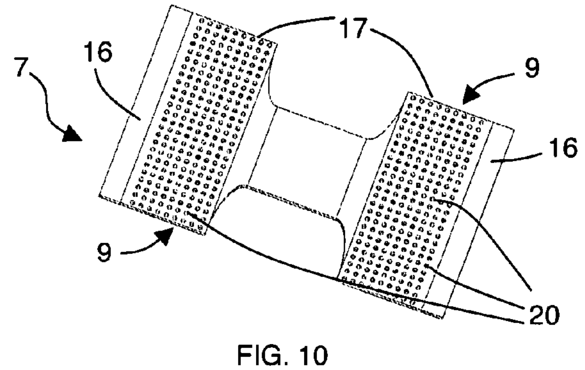

In the alternative embodiment represented in FIG. 10, the beam 7 of the variable inductor 1 comprises a plurality of holes 20, preferably circular or elliptical, made in the stress generation zone 17, adjacent to the anchoring zone 16, of the transverse parts 9 of the beam 7. Such holes 20 notably make the process of releasing the beam 7 easier when the variable inductor 1 is fabricated, as described below.

In another alternative embodiment, not represented, holes can also be made in the transition zones 18 of the beam 7, as a complement to the holes 20 made in the stress generation zones 17 or as a replacement for the latter.

In other alternative embodiments, not represented, the transverse parts 9 can be in the form of parallel strips of material spaced apart at regular intervals, connected to the central branch 10 and to the anchoring zones 16. Likewise, the central branch 10 can also be formed by parallel strips of material connected to the transverse parts 9.

Figure 11:
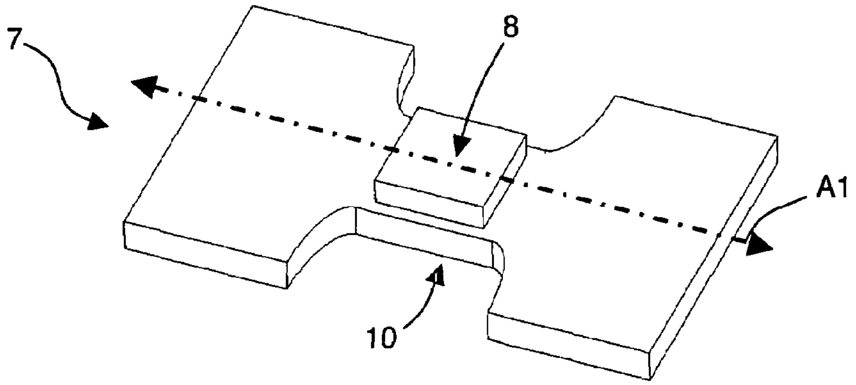
FIGS. 11 to 13 are top views of alternative embodiments of a magnetic device according to FIG. 3, only representing the beam and the magnetic element.
Figure 12:
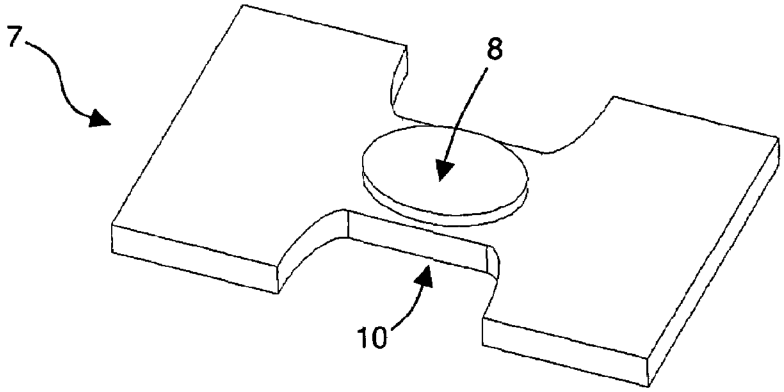
Figure 13:
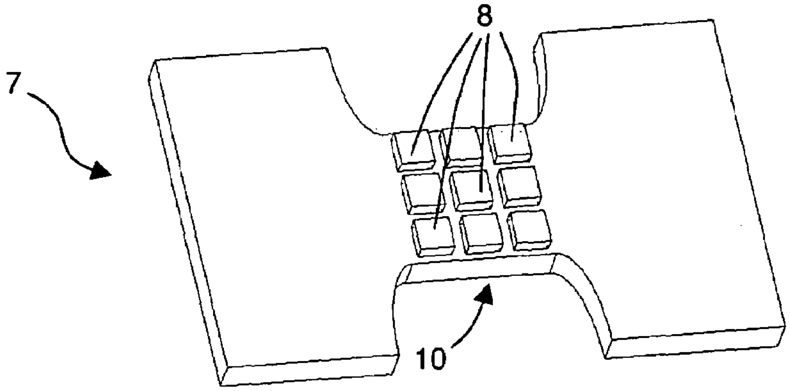

In the particular embodiments represented in FIGS. 11 to 13, only the piezoelectric material beam 7 and the associated magnetic element 8 arranged on the central branch 10 of the beam 7 are represented. In FIG. 11, the magnetic element 8 has a cross-section of rectangular or square shape. In FIG. 12, the magnetic element 8 has a cross-section of ellipsoid shape. In FIG. 13, the magnetic element 8 is composed of a plurality of non-joined elemental elements, preferably of rectangular or ellipsoid shape, preferably arranged side by side on the central branch 10 of the beam 7, and preferably regularly.

In general manner, in the case of use of a uniaxial magnetic material for the magnetic element 8, the axis of anisotropy of the material has to be parallel or perpendicular to the reference longitudinal axis A1 of the piezoelectric material beam 7 (FIG. 11).

For example, for a variable inductor 1 with a beam 7 as described above, a magnetic element 8 of parallelepipedic shape and a coil 12 of solenoid type, the number of turns is for example comprised between 3 and 20. The width of the magnetic element 8 is about 50 to 300 μm, the thickness of the magnetic element 8 is about 100 nm to 2 μm and the length of the magnetic element 8 is about 50 to 300 μm.

Considering the above examples of values, the electromagnetic properties of the coil 12 (inductance, resistance, capacitance, quality factor, etc.) can be calculated finely by means for example of a finite elements simulation software, such as the "HFSS" software from Ansoft. Furthermore, the lower electrodes 11*a* and upper electrodes 11*b* have to be as thin as the production method allows, for example about 50 nm to 1 μm.

The thickness of the beam 7 is for example about 100 nm to 2 μm. In general manner, the thickness of the piezoelectric material beam 7 is a trade-off between the actuating voltage, which decreases with the thickness, and transmission of the stress to the magnetic element 8, which is impaired if the beam 7 is too thin.

For example, in FIG. 7, the central branch 10 of the beam 7 constituting the useful zone 19 of the beam 7 is preferably hardly larger than the magnetic element 8, with a production margin of about 10 μm, to obtain a maximum deformation amplitude. The dimensions of the magnetic element 8 therefore fix the corresponding dimensions W2 and L4 of the central branch 10. The length L1 of the anchoring zone 16 can then be as small as the mechanical strength of the anchoring allows (notably dependent on the fabrication method used).

To dimension the lengths L2 and L3, respectively of the zone 17 and of the transition zone 18 of the transverse parts 9, and also the width W1 of the transverse parts 9, a finite elements simulation software can be used, such as the "ANSYS" software. In general manner, an increase of the length L2 and of the width W1 tends to increase the intensity of the stresses applied to the useful zone 19 to the detriment of the overall size, whereas an increase of the length L3, which is typically about 50 μm to 300 μm, improves the uniaxial and homogeneous nature of the stresses.

In general manner, the maximum voltage applied has to generate stresses that are lower than the plasticity threshold of the materials used for the piezoelectric material beam 7, the magnetic element 8 or the actuating electrodes 11. Likewise, in the case of application of a compressive stress, the voltage applied must not cause buckling of the piezoelectric material beam 7.

Figure 14:
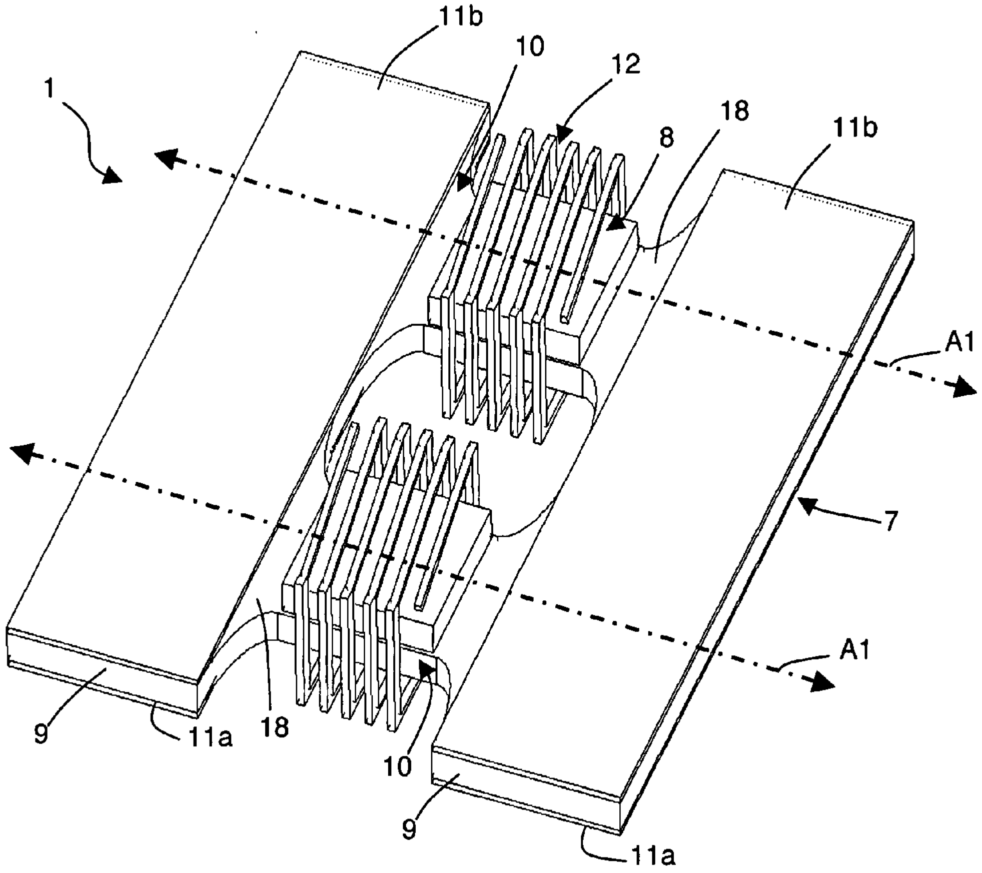
FIG. 14 schematically represents a perspective view of another alternative embodiment of a magnetic device according to the invention.

In FIG. 14, the alternative embodiment of the variable inductor 1 differs from the previous embodiments by the number of central branches 10 of the piezoelectric material beam 7. The inductor 1 still comprises two transverse parts 9, connected by two central branches 10, each cooperating with a magnetic element 8 and, for example, with a solenoid coil 12. The lower electrodes 11*a* and upper electrodes 11*b* preferably cover the whole of the surface of the transverse parts 9, and the central branches 10 are connected to the transverse parts 9 by transition zones 18, preferably with elliptical shapes. The coils 12 can be connected in series or in parallel.

The use of such an inductor 1 including several coils 12 and several magnetic elements 8 governed by the same actuating device, i.e. the same piezoelectric material beam 7, in particular enables the overall dimensions of the variable inductor 1 to be reduced and the total inductance density to be increased.

In other alternative embodiments, not represented, the two central branches 10 of the beam 7 can be associated with other types of electrically conducting elements, as represented in FIGS. 4 to 6, and/or with other forms of magnetic elements 8, as represented in FIGS. 11 to 13, and/or with other shapes of transition zones 18, as represented in FIGS. 7 to 10.

A method for producing an integrated variable inductor 1 will be described in greater detail with regard to FIGS. 15 to 20. In the following description, the production method is designed for production of an inductor 1 with a profiled beam, as described above, comprising a solenoid type coil 12 (FIG. 3). In this case, the piezoelectric material beam 7 is securely fixed to the substrate on which the inductor is made by means of lateral ends 23 advantageously made with the same layers of material as the coil 12, as described below and illustrated in FIGS. 15 to 20.

Figure 15:
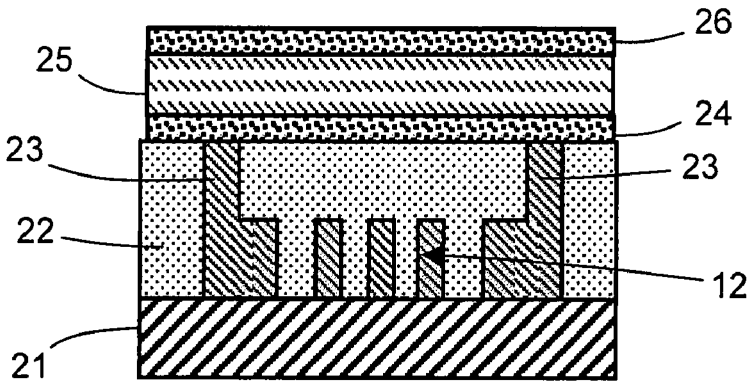
FIGS. 15 to 20 represent cross-sectional side views (FIGS. 15, 16, 18, 19) and top views (FIGS. 17, 20) of different steps of a particular embodiment of a method for fabricating a magnetic device according to the invention.

In FIG. 15, the production method first comprises formation on a substrate 21, for example by electrolysis or physical deposition, of a bottom part of the coil 12 made from a high-conductivity material, for example copper, aluminum or gold, followed by encapsulation of said bottom part by a first sacrificial layer 22, leaving the lateral ends 23 flush. The sacrificial layer 22 is for example made from silicon oxide deposited by plasma enhanced chemical vapor deposition (PECVD) or from polymer resin. A mechanical or chemical mechanical planarization step of the sacrificial layer 22 can also be performed.

As an alternative, the lateral ends 23 can be deposited for example by electrolysis and can be formed from a different material from that of the bottom part of the coil 12. The part of the sacrificial layer 22 surrounding the lateral ends 23 can be of a different nature from the part surrounding the coil 12 adjacent to the substrate 21.

The method then comprises deposition of a stack of a first conducting metal layer 24 designed to form the lower electrodes 11*a* of the inductor 1, of a piezoelectric material layer 25 designed to form the beam 7 of the inductor 1, and of a second conducting metal layer 26 designed to form the upper electrodes 11*b* of the inductor 1 (FIG. 15).

For example, the piezoelectric material layer 25 is deposited by a physical vapor deposition (PVD) process, and the lower electrodes can be made of platinum for a lead titanium zirconate (PZT) piezoelectric beam, or of molybdenum for an aluminum nitride (AlN) piezoelectric beam. The upper electrodes can be of a different nature from the lower electrodes, for example made of gold, copper or tungsten, etc. Complementary protective layers (not represented), for example made of gold or tungsten, can be provided, in particular to facilitate subsequent release of the inductor.

Figure 16:
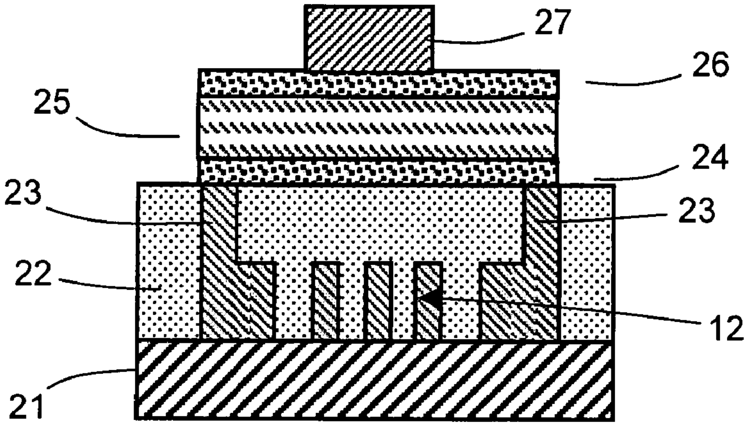
Figure 17:
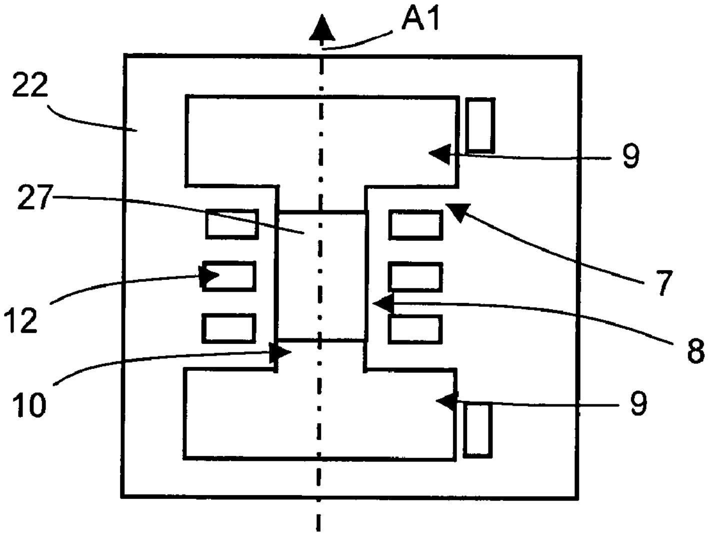

In FIGS. 16 and 17, before the sacrificial layer 22 is eliminated, an etching step of the stack of the layers 24, 25, 26 is then performed to delineate the characteristic shape of the beam 7 of the inductor 1. Patterning of the layers 24, 25, 26 can be performed by a chemical method of wet etching or physical chemical etching type, or of dry etching or reactive ionic etching (RIE) type. As represented in FIG. 16, the edge of the stack of the three layers 24, 25, 26 forming the beam 7 is then associated with the lateral ends 23.

A layer 27 of uniaxial magnetic material (FIG. 16) is then deposited and etched to form the magnetic element 8 placed on the central branch 10 of the previously formed beam 7 (FIG. 17). For example, the magnetic element 8 can be obtained by physical vapor deposition (PVD) of an iron- and/or nickel- and or cobalt-based alloyed material. The layer 27 can also be formed by a stack of different dielectric and conducting layers.

In FIG. 17, patterning of the layers 24, 25, 26 by etching thus enables the characteristic shape of the beam 7 to be obtained, with two transverse parts 9 perpendicular to the reference axis A1 of the beam 7 and a central branch 10 on which the magnetic element 8 is achieved. All that remains to be done is to close the coil 12 to obtain the inductor 1 as represented in FIG. 20.

Figure 18:
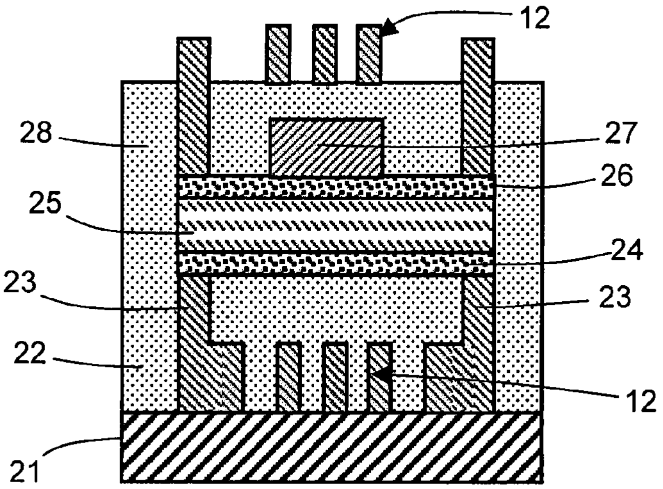
Figure 19:
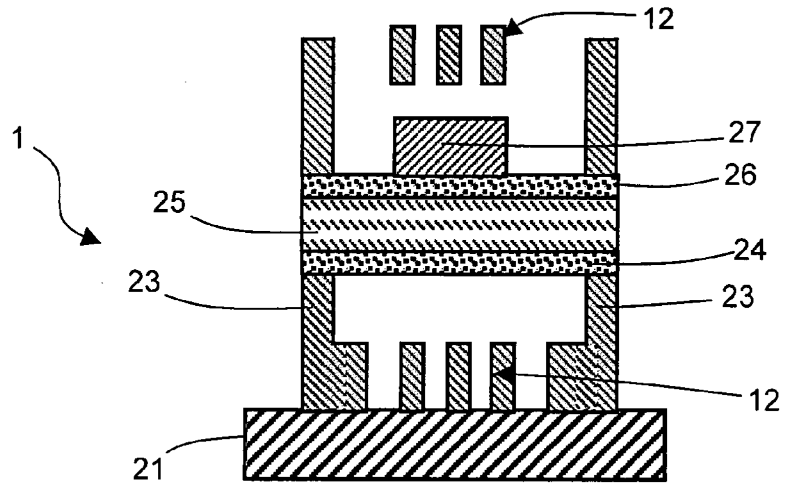
Figure 20:
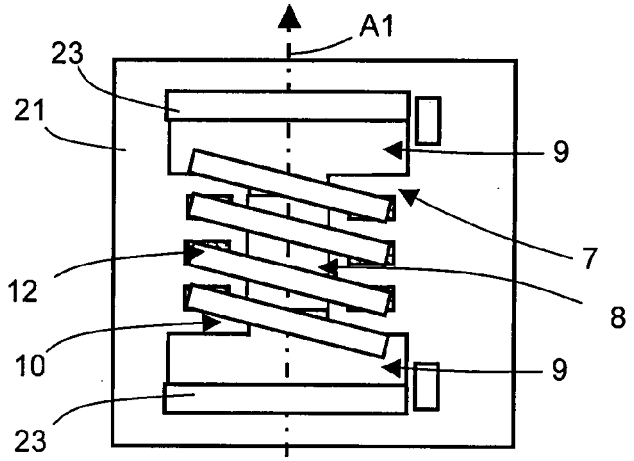

In FIGS. 18 to 20, a second sacrificial layer 28, of identical or different nature from the first sacrificial layer 22, is then deposited on the previously formed beam 7 so as to be able to form the top part of the coil 12 (FIG. 18). Finally, elimination of the sacrificial layers 22 and 28 enables the structure formed in this way to be released. The inductor 1 is then suspended and anchored on the substrate 21 by means of the lateral ends 23, as represented in FIG. 19.

Formation of the top part of the coil 12 can be achieved by etching and contact resumption through the sacrificial layer 28 by a chemical or physical chemical method or by reactive ionic etching. Deposition of the top part of the coil 12 can be performed by electrolysis and can be achieved from a different material from that of the bottom part of the coil 12. Release of the structure can be performed by selective chemical etching of the wet etching or physical chemical etching (RIE) type, of the sacrificial layers 22 and 28.

In FIG. 20 illustrating a top view of the finished inductor 1, the method according to the invention enables an inductor 1 embedded at both ends to be obtained with a characteristic shape enabling the magnetic element and the coil to be placed substantially in its central part in order to concentrate the stresses and make them as uniaxial and homogeneous as possible. Such a production method thus uses fabrication techniques originating from microelectronics and adapted for microsystems.

Such an integrated variable inductor 1 according to the different embodiments described above therefore enables a homogeneous and uniaxial stress—either tensile or compressive—to be applied to the magnetic element, and enables the value of these stresses to be maximized for a given actuating voltage, due in particular to the characteristic form and shape of its beam.

Moreover, the use of a released piezoelectric material beam embedded at both ends enables the mechanical and electromagnetic properties of the variable inductor according to the invention to be improved, so as to obtain large, continuous or discontinuous, reversible inductance variations with low actuating voltages, while at the same time keeping good frequency properties, in partial at high frequencies.

The invention is not limited to the different embodiments described above. The values of widths and lengths of the different zones of the beam 7 are non-restrictive and depend in particular on the required size of the variable inductor 1 and on the required inductance value. The electrodes 11 can extend above the transition zones 18 of the beam 7 (FIG. 7). In the alternative embodiment represented in FIG. 14, the inductor 1 can comprise more than two central branches 10, all associated with a corresponding magnetic element 8 and with a corresponding electrically conducting element, preferably of the solenoid coil type.

In the alternative embodiment represented in FIG. 21, the piezoelectric material beam 7 comprises a first transverse part 9 made of piezoelectric material, as represented in FIG. 7, cooperating with the lower electrodes 11*a* and the upper electrodes 11*b*, and a second transverse part 9, of much smaller length, only comprising the anchoring zone 16 of the beam 7 to the substrate. The operating principle of the inductor 1 is the same, with a solenoid coil 12 and a magnetic element 8 placed on the central branch 10 of the beam 7.

Figure 22:
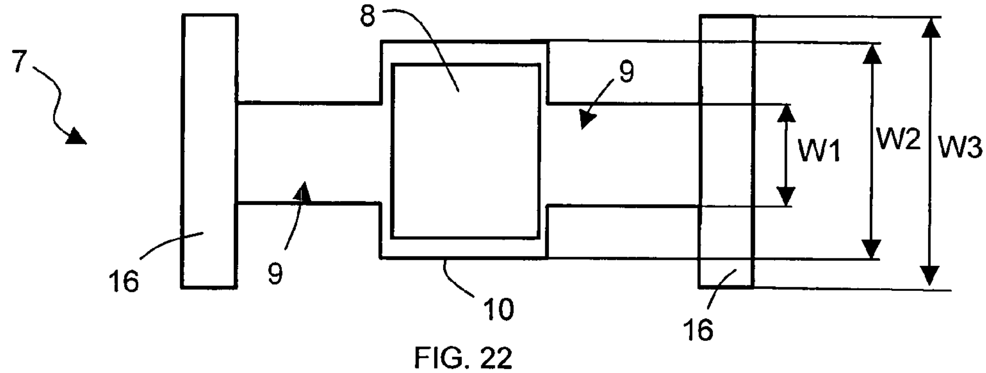
FIG. 22 very schematically represents a top view of a beam of another alternative embodiment of a magnetic device according to the invention.

In another alternative embodiment represented in FIG. 22, the width W1 of the transverse parts 9 can be smaller than the width W3 of the corresponding anchoring zones 16. Moreover, the width W2 of the central branch 10 on which the magnetic element 8 is placed can be larger than the width W1 of the transverse parts 9. In general manner, the widths W1, W2 and W3 of the different zones of the beam 7 are not linked to one another and the beam 7 can take a completely different complex shape.

In another alternative embodiment, not represented, the piezoelectric material beam 7 and the associated magnetic element 8 can be encapsulated in layers 22 and 28 of sufficiently soft insulating material, for example a polymer resin with a low dielectric constant, to enable a sufficient deformation of the beam 7 with respect to the substrate without having to remove the layers 22 and 28. It is then no longer necessary to perform releasing of the beam 7.

In general manner, the invention applies to any variable-response magnetic device in the form of a beam 7 comprising an element made of piezoelectric material. The piezoelectric material element can be formed by the whole beam 7 or only by parts of the beam, i.e. a part of a transverse part 9, a whole transverse part 9 or both the transverse parts 9, the central branch 10 and the transition zones 18 then being able to be made from another material.

The invention applies in particular to any type of reconfigurable electronic circuit for which a limitation of the number of components is sought for by using adjustable components. The principle used to make the dynamic permeability vary, as well as practical application of this principle, are not limited in terms of inductance or operating frequency values. The invention therefore applies to all the fields where a continuous (or discontinuous) and reversible dynamic permeability variation is necessary, with a very low actuating power, in particular reconfigurable multiband circuits, fine impedance tuning and tunable oscillators.

The invention also applies to other types of variable-response magnetic devices, according to the manner in which the magnetic element 8 is associated with the electrically conducting element (the coil 12 for example). In general manner, the magnetic element has to be mechanically secured to the piezoelectric material beam so that deformations of said beam generate a variation of the magnetic properties of the magnetic element.

Thus, in the case where the electrically conducting element is placed at a distance from the magnetic element on one side of the magnetic element only, for example in the case of the element in serpentine form 13 (FIG. 4), in the form of lines 14 (FIG. 5) or in the form of a spiral 15 (FIG. 6), or on both sides of the magnetic element 8, for example in the case of the element in the form of a solenoid 12 (FIG. 3), the magnetic device is then a variable inductor.

In the case where the electrically conducting element is placed on one side of the magnetic element only, it is also possible to achieve line transmission elements such as resonators, phase shifters, couplers, antennas, filters, etc.

Figure 23:
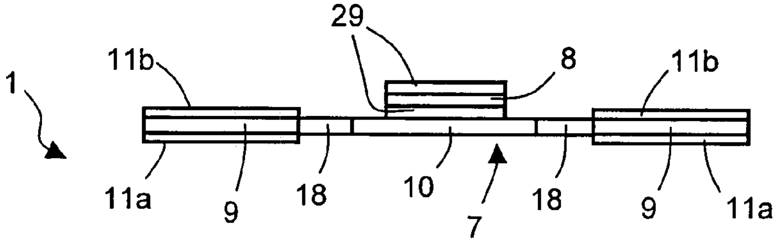
FIG. 23 very schematically represents a side view of a beam of another alternative embodiment of a magnetic device according to the invention.

In FIG. 23, in the case where an electrically conducting element 29 is placed both between the central branch 10 of the beam 7 and the magnetic element 8 and above the magnetic element 8, preferably in contact on both sides of the magnetic element 8, a spin oscillator 1 can then be achieved.

We claim:

1. A variable-response magnetic device integrated on a substrate and comprising at least one element made of piezoelectric material associated with actuating electrodes, and at least one magnetic element able to deform under the stress of the element made of piezoelectric material, wherein the device is in the form of a beam, movable with respect to the substrate and comprising two transverse parts of predetermined width, along a reference longitudinal axis, and wherein:

the piezoelectric material element is formed by at least one part of a transverse part, each transverse part comprises a zone for mechanical anchoring on the substrate, and the transverse parts are connected by at least one central branch of predetermined width on which the magnetic element is arranged.

2. The device according to claim 1, wherein the width of the central branch is smaller than the width of the transverse parts.

3. The device according to claim 1, wherein the two transverse parts are made of piezoelectric material.

4. The device according to claim 1, wherein the central branch is made of piezoelectric material.

5. The device according to claim 1, wherein the actuating electrodes extend partially on the surface of the transverse parts of the beam.

6. The device according to claim 5, wherein the actuating electrodes are situated on each side of the piezoelectric material element.

7. The device according to claim 1, wherein each transverse part is extended by a transition zone extending up to the corresponding central branch.

8. The device according to claim 7, wherein the transition zone is of variable cross-section.

9. The device according to claim 7, wherein the transition zone has an elliptical shape tangent to the associated transverse part and central branch.

10. The device according to claim 7, wherein the transition zone comprises a plurality of holes.

11. The device according to claim 1, wherein each transverse part comprises a plurality of holes.

12. The device according to claim 1, wherein the magnetic element comprises a uniaxial magnetic material having an axis of anisotropy parallel to the reference axis of the beam.

13. The device according to claim 1, wherein the magnetic element comprises a uniaxial magnetic material having an axis of anisotropy perpendicular to the reference axis of the beam.

14. The device according to claim 1, wherein the magnetic element has a cross-section of substantially rectangular shape.

15. The device according to claim 1, wherein the magnetic element has a cross-section of substantially ellipsoid shape.

16. The device according to claim 1, wherein the magnetic element is composed of a plurality of non-joined elemental magnetic elements arranged side by side on the central branch of the beam.

17. The device according to claim 1, comprising at least one electrically conducting element associated with the magnetic element.

18. The device according to claim 17, wherein the electrically conducting element is a solenoid coil.

19. The device according to claim 18, wherein the coil surrounds the magnetic element.

20. The device according to claim 17, wherein the electrically conducting element is a wire in the form of a serpentine.

21. The device according to claim 17, wherein the electrically conducting element is a wire in the form of lines.

22. The device according to claim 17, wherein the electrically conducting element is a wire in the form of a spiral.

23. The device according to claim 20, wherein the electrically conducting element is located at a distance from the magnetic element.

24. The device according to claim 23, wherein the electrically conducting element is arranged on one side of the magnetic element only.

25. The device according to claim 17, wherein the electrically conducting element is arranged on both sides of and in contact with the magnetic element.

26. The device according to claim 1, wherein the beam is encapsulated in a soft insulating material.

* * * * *